United States Patent
Chao et al.

(10) Patent No.: US 8,216,640 B2
(45) Date of Patent: Jul. 10, 2012

(54) METHOD OF MAKING SHOWERHEAD FOR SEMICONDUCTOR PROCESSING APPARATUS

(75) Inventors: Ben-Son Chao, Hsin-Chu (TW); Yu-Feng Chang, Hsin-Chu (TW); Yen-Si Chen, Hsin-Chu (TW)

(73) Assignee: Hermes-Epitek Corporation, Taipei (TW)

( * ) Notice: Subject to any disclaimer, the term of this patent is extended or adjusted under 35 U.S.C. 154(b) by 382 days.

(21) Appl. No.: 12/567,676

(22) Filed: Sep. 25, 2009

(65) Prior Publication Data

US 2011/0076401 A1 Mar. 31, 2011

(51) Int. Cl.
*C23C 16/00* (2006.01)

(52) U.S. Cl. ............. 427/248.1; 427/249.4; 427/249.15; 427/255.31; 427/255.394

(58) Field of Classification Search ............... 427/248.1, 427/249.1, 255.31, 255.394, 249.4, 249.15
See application file for complete search history.

(56) References Cited

U.S. PATENT DOCUMENTS

| | | | | |
|---|---|---|---|---|
| 5,680,013 A * | 10/1997 | Dornfest et al. | ......... | 315/111.21 |
| 6,050,506 A * | 4/2000 | Guo et al. | ...................... | 239/558 |
| 6,086,677 A * | 7/2000 | Umotoy et al. | ............... | 118/715 |
| 6,182,603 B1 * | 2/2001 | Shang et al. | ........... | 118/723 ME |
| 6,237,528 B1 * | 5/2001 | Szapucki et al. | .......... | 118/723 E |
| 6,786,175 B2 * | 9/2004 | Dhindsa et al. | ........... | 118/723 E |
| 6,793,733 B2 * | 9/2004 | Janakiraman et al. | ........ | 118/715 |
| 7,479,303 B2 * | 1/2009 | Byun | ......................... | 427/248.1 |
| 7,540,823 B2 * | 6/2009 | Kilian et al. | ...................... | 477/3 |
| 7,605,845 B2 * | 10/2009 | Batur | ......................... | 348/208.6 |
| 7,615,251 B2 * | 11/2009 | Kakimoto et al. | ......... | 427/255.4 |
| 2004/0058070 A1 * | 3/2004 | Takeuchi et al. | .............. | 427/282 |
| 2004/0092120 A1 * | 5/2004 | Wicker | ......................... | 438/710 |
| 2005/0173569 A1 * | 8/2005 | Noorbakhsh et al. | ......... | 239/690 |
| 2006/0046096 A1 * | 3/2006 | Nomura et al. | ............... | 428/690 |
| 2006/0105104 A1 * | 5/2006 | Tada | ......................... | 427/248.1 |
| 2006/0263522 A1 * | 11/2006 | Byun | ......................... | 427/248.1 |
| 2008/0216958 A1 * | 9/2008 | Goto et al. | .............. | 156/345.35 |
| 2008/0295872 A1 * | 12/2008 | Riker et al. | ................... | 134/105 |
| 2009/0095222 A1 * | 4/2009 | Tam et al. | ................. | 118/723 R |
| 2011/0198034 A1 * | 8/2011 | Sun et al. | ................. | 156/345.34 |

FOREIGN PATENT DOCUMENTS

EP 0595054 A1 * 9/1993

OTHER PUBLICATIONS

Hui, Li, "Mass transport analysis of a showerhead MOCVD reactor". Journal of Semiconductors, vol. 32, No. 3, Mar. 2011, pp. 1-5.*
Hash, D.B., et al., "Characterization of showerhead performance at low pressure". J. Vac. Sci. Technol. B 18(6), Nov./Dec. 2000, pp. 2808-2813.*

* cited by examiner

*Primary Examiner* — Bret Chen
(74) *Attorney, Agent, or Firm* — Stout, Uxa, Buyan & Mullins, LLP

(57) ABSTRACT

A method of making a showerhead for a semiconductor processing apparatus is disclosed. In one embodiment, the method includes providing a substrate; forming first holes in the substrate; forming a protective film on the substrate, where the protective film covers sidewalls of the first holes; and forming second holes in the substrate, where a part of the protective film within the first holes is removed. In another embodiment, the method includes providing a substrate; forming islands on the substrate; forming a protective film on the substrate, where the protective film does not cover the tops of the islands; and forming holes in the islands.

21 Claims, 5 Drawing Sheets

METHOD OF MAKING SHOWERHEAD FOR SEMICONDUCTOR PROCESSING APPARATUS

BACKGROUND OF THE INVENTION

1. Field of the Invention

The present invention generally relates to a showerhead for a semiconductor processing apparatus, and more particularly to a showerhead for reducing contamination during semiconductor material processing.

2. Description of the Prior Art

In a typical plasma apparatus for etching and chemical vapor deposition (CVD) of materials on wafers, process gases are supplied into a process chamber through a showerhead, and then radio frequency (RF) waves are applied to the showerhead so as to generate a plasma of the process gases. The plasma is used to remove materials by etching or for deposition of materials on wafers. Plasma etch conditions within a process chamber tend to create a significant ion bombardment of the surfaces thereof that are exposed to the plasma.

This ion bombardment, combined with plasma chemistries and/or etch byproducts, can produce significant erosion, corrosion and corrosion-erosion of the plasma-exposed surfaces of the process chamber. As a result, the surface materials are removed by way of physical and chemical attack. This attack causes problems including short part-lifetimes, increased consumable costs, and increased generation particles and/or contamination.

For the reason that there are disadvantages suffered by the prior art mentioned above, there is a need to propose a novel showerhead having materials that provide improved resistance to physical and chemical attack so as to increase the service life of the showerhead and minimize the associated contamination of semiconductor materials during plasma processing. Materials that can increase the service life of components of the equipment and thus reduce the down time of the apparatus could contribute to reducing costs, and/or increasing efficiency and quality, of the processing of such semiconductor materials.

SUMMARY OF THE INVENTION

Accordingly, the present invention has been made in order to meet such a need as described above, and it is an object of the present invention to provide a method of making a showerhead. The showerhead includes materials that provide improved resistance to physical and chemical attack so as to increase the service life of the showerhead.

It is another object of the present invention to provide a method of making a showerhead. The showerhead includes materials that provide improved resistance to physical and chemical attack so as to minimize the associated contamination of semiconductor materials during plasma processing.

In order to achieve the above objects, the present invention provides a method of making a showerhead for a semiconductor processing apparatus that includes providing a substrate and forming a plurality of first holes in the substrate. The method further includes forming in the substrate a protective film that covers sidewalls of said first holes and forming in the substrate a plurality of second holes whereby a part of said protective film within the first holes is removed.

In another embodiment, the method includes providing a substrate; forming a plurality of islands on the substrate; forming a protective film on the substrate wherein the protective film does not cover the tops of the islands; and forming a plurality of holes in the islands.

In one embodiment, the semiconductor processing apparatus is a plasma etching apparatus, but the invention is not limited to this. The semiconductor processing apparatus can be a CVD apparatus or another semiconductor processing apparatus which is used in plasma related processes.

By way of the showerhead structures and processes of the present invention, the cost of making the showerhead is decreased. The service life of the showerhead is increased, and the associated contamination of semiconductor materials during plasma processing is minimized. Since the service life of the showerhead is increased, the down time of the apparatus is reduced. The preceding is contemplated to contribute substantially to reducing the cost of processing semiconductor materials.

DETAILED DESCRIPTION OF THE INVENTION

A detailed description of the present invention will be discussed in connection with the following embodiments, which are not intended to limit the scope of the present invention and which can be adapted for other applications. While the drawings are illustrated in detail, it is appreciated that the quantity of the disclosed components may be greater or less than that disclosed, except for instances expressly restricting the amount of the components.

Figure 1:
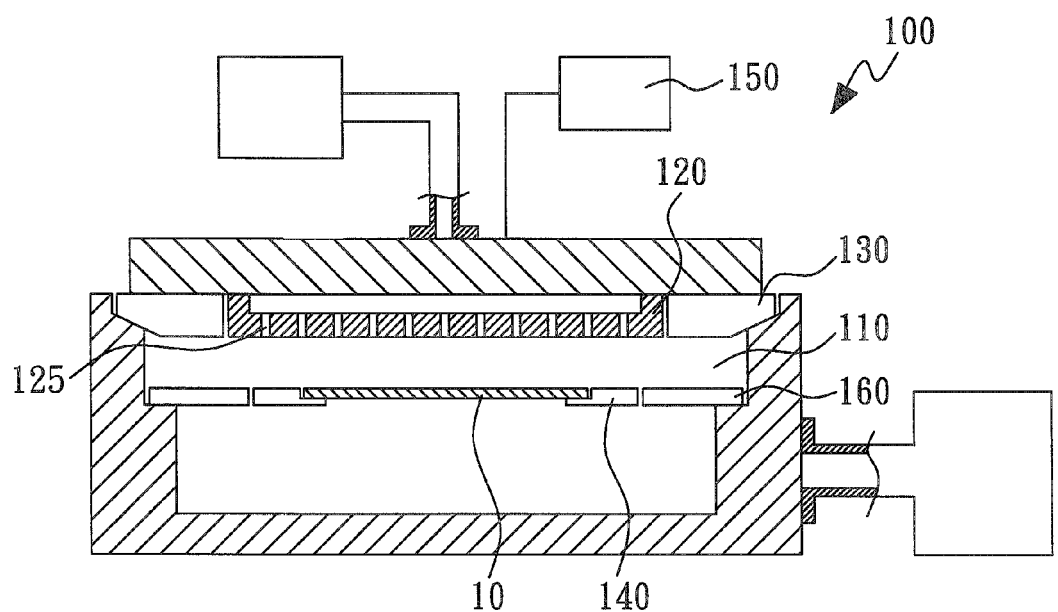
FIG. 1 is an explanatory view showing an overall plasma etching apparatus relating to the present invention.

The present invention provides a showerhead for a semiconductor processing apparatus, wherein the semiconductor processing apparatus can be a plasma etching apparatus or a CVD apparatus. FIG. 1 is an explanatory view showing an overall plasma etching apparatus relating to the present invention. The plasma etching apparatus 100 comprises a process chamber 110, in which a film is formed on a surface of a wafer 10. In the process chamber 110, a showerhead 120 is disposed to face the wafer 10, and plasma is generated therein so as to form the film on the surface of the wafer 10.

Figure 2:
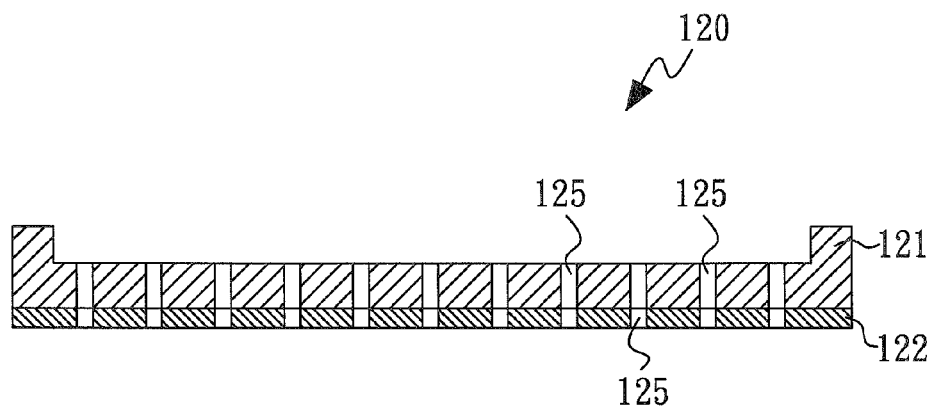
FIG. 2 shows a sectional view of the showerhead shown in FIG. 1.

The showerhead 120 is assembled on an upper-focus-ring 130. The wafer 10 is supported on a lower-focus-ring 140 facing the showerhead 120. The lower-focus-ring 140 is assembled on a lower-cover-ring 160. The showerhead 120 is connected to a radio frequency (RF) generator 150 having a matching circuit. The RF generator 150 applies RF waves to the showerhead 120 for forming a film on the wafer 10. Process gases are supplied into the process chamber 110 through a plurality of gas holes 125 of the showerhead 120, and then RF waves are applied to the showerhead 120 so as to generate a plasma of the process gases. As shown in FIG. 2, the showerhead 120 includes a substrate 121 and a protective film 122. A plurality of gas holes 125 pass through the substrate 121 and the protective film 122. The protective film 122 covers that surface of the substrate 121 which is to be exposed to plasma within the process chamber 110 of the plasma etching apparatus 100.

Although the semiconductor processing apparatus described above is the plasma etching apparatus 100, the semiconductor processing apparatus is not limited to a plasma etching apparatus. The semiconductor processing apparatus can be, for example, a chemical vapor deposition (CVD) apparatus or other semiconductor processing apparatus which is used in plasma related processes.

Figure 3:
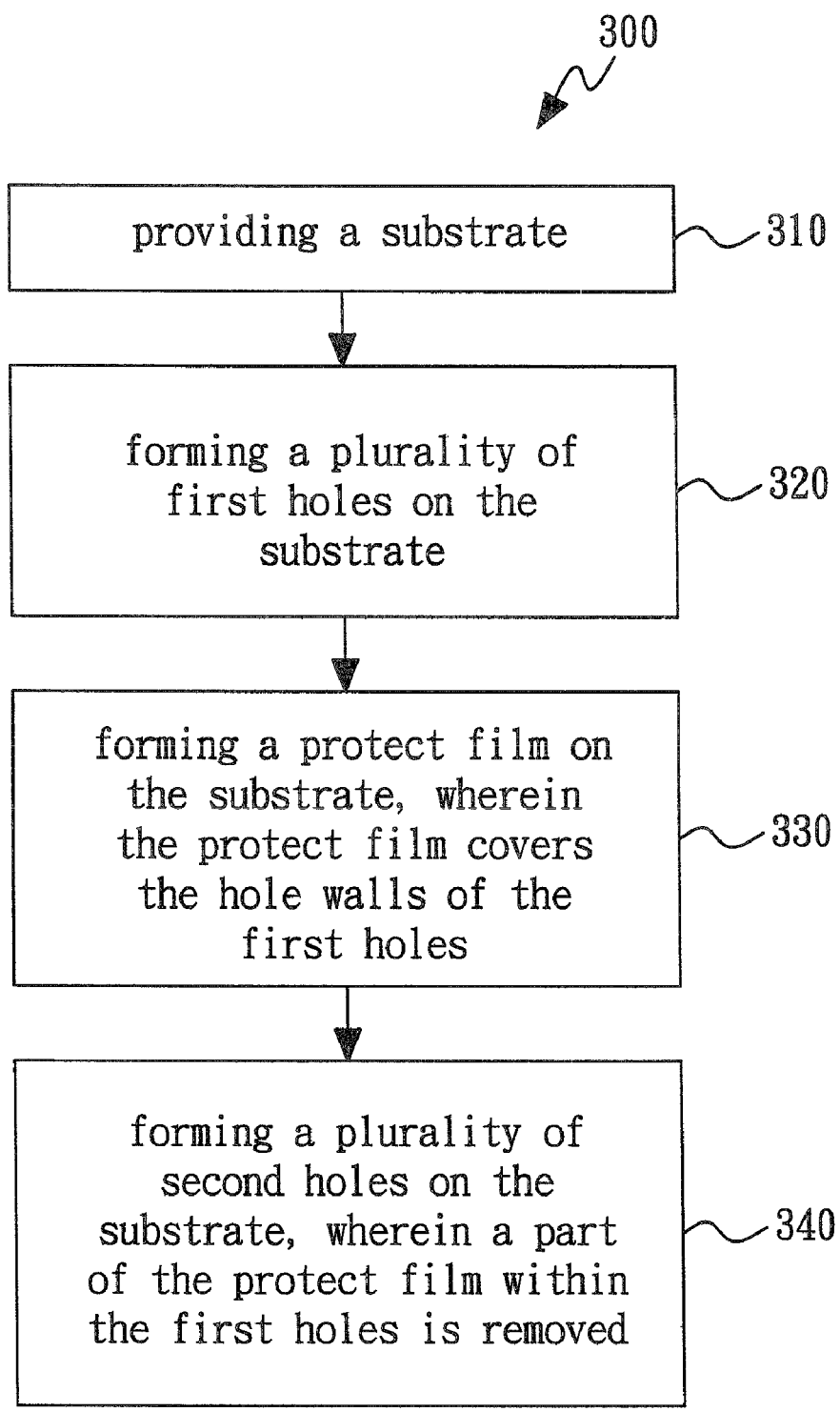
FIG. 3 shows a flow diagram for a method of making a showerhead in accordance with an embodiment of the present invention.

FIG. 3 shows a flow diagram for a method of making a showerhead in accordance with an embodiment of the present invention. The method 300 includes the following steps: step 310, providing a substrate; step 320, forming a plurality of first holes in the substrate; step 330, forming a protective film on the substrate, wherein the protective film covers the sidewalls of said first holes; and step 340, forming a plurality of second holes in the substrate, wherein a part of said protective film within the first holes is removed.

Figure 4A:
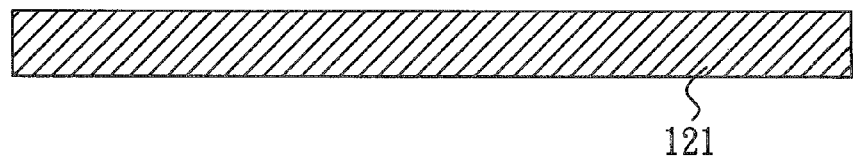
FIGS. 4A-4D show the steps for making the showerhead.
Figure 4B:
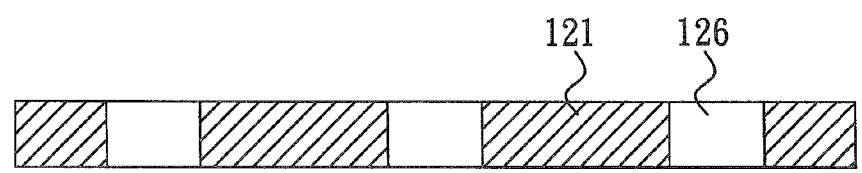
Figure 4C:
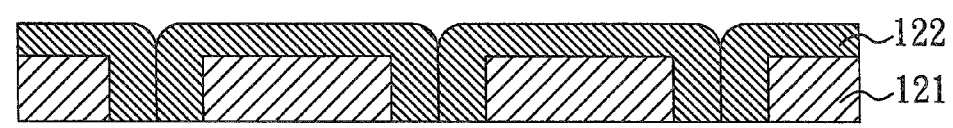

FIGS. 4A-4D show the steps for making the showerhead 120. Referring to FIG. 4A, a substrate 121 is provided. In this embodiment, the substrate 121 is a graphite substrate. Referring to FIG. 4B, a plurality of first holes 126 are formed in the substrate 121. The first holes 126 are formed by a machine drilling technique without cutting fluid. Referring to FIG. 4C, a protective film 122 is formed on the substrate 121, wherein the protective film 122 covers the sidewalls of the first holes 126. In this embodiment, the protective film 122 is a silicon carbide film which is formed by chemical vapor deposition. The thickness of the silicon carbide film is greater than or equal to about 3 mm. The silicon carbide film is composed of a hi-resistivity material with an electric resistance higher than 1000 ohm per cm.

Figure 4D:
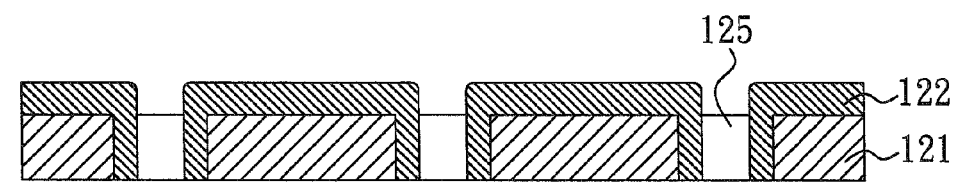

Referring to FIG. 4D, a plurality of second holes 125 are formed in the substrate 121, wherein a part of the protective film 122 within the first holes 125 is removed. In this embodiment, the first holes 125 are formed by machine drilling with cutting fluid.

The graphite substrate has a low mechanical strength. The graphite substrate can be machined easily. For example, the holes of the substrate 121 can be formed by machine drilling without cutting fluid.

The silicon carbide film which is formed by chemical vapor deposition has many properties which may render it a difficult material from which to fabricate articles. The hardness renders silicon carbide film difficult to machine. For example, the holes of the silicon carbide film cannot be formed by machine drilling without cutting fluid. Because the graphite substrate is porous, if the gas holes 125 are formed by machine drilling with cutting fluid, the cutting fluid will be retained within the graphite substrate.

In this embodiment, referring to FIG. 4D, the protective film 122 covers the sidewalls of the first holes 126. Thus, the cutting fluid which is used in the machine drilling process of the protective film 122 will not be retained within the graphite substrate.

In this embodiment, the protective film 122 is a silicon carbide film which is formed by chemical vapor deposition. The thickness of the silicon carbide film is greater than or equal to about 3 mm. The electric resistance of the silicon carbide film is about 1000000 ohm per cm. Because the electric resistance of the protective film 122 is high, the substrate 121 is or functions as a conductive substrate, such as a graphite substrate. The graphite substrate is connected to the ground of the plasma etching apparatus 100. Although the substrate 121 is made from graphite in this embodiment, the substrate 121 can also be made from other substrate materials, including, but not limited to, single crystal silicon, polycrystalline silicon, silicon carbide, quartz and sapphire.

The protective film 122 (e.g., the silicon carbide film which is formed by chemical vapor deposition) is highly thermally conductive, chemically and oxidatively stable, heat stable, hard, and/or scratch-resistant. Typically, the protective film 122 possesses all of the preceding characteristics. Thus, the silicon carbide film is capable of enduring the plasma within the process chamber 110. The service life of the showerhead 120 is increased and the associated contamination of semiconductor materials during plasma processing is minimized.

The graphite substrate has a thermal expansion coefficient substantially the same as that of silicon carbide. Thus, the showerhead 120 can bear the thermal shock during the plasma process. During the plasma process, the showerhead 120 is repeatedly heated and cooled. If the difference between the thermal expansion coefficients of the substrate 121 and the protective film 122 is too high, the protective film 122 may peel off the substrate 121.

Although the protective film 122 is made from silicon carbide in this embodiment, the protective film 122 can also be made from other materials which, for example, can bear the environment during the plasma process. For example, the protective film 122 can be made from hi-resistivity oxide materials, including, but not limited to, one or more of $Y_2O_3$, $ZnO_2$, $ZrO_2$, $HfO_2$, $TiO_2$, and $Bi_2O_3$.

Additionally, other materials, such as metal-doped oxide materials, two phase oxide materials, rare-earth oxide materials, and/or thin-film CVD materials, which, for example, can bear the environment during the plasma process, are also suitable to be the material of the protective film 122. The protective film 122 can be made from one or more metal-doped oxide materials, including, but not limited to, $Y_2O_3$, Eu, and ZnO—Al; the protective film 122 can be made from one or more two phase oxide materials, including, but not limited to, $Al_2O_3$, $ZrO_2$, and $Y_2O_3$; the protective film 122 can be made from one or more rare-earth oxide materials, including, but not limited to, $Gd_2O_3$, $Nd_2O_3$, and $Yb_2O_3$; the protective film 122 can be made from one or more thin-film CVD materials, including, but not limited to, AlN, BN, and SiC. Moreover, the protective film 122 can include any operable combination of the preceding and/or at least one layer of carbon nanotube which can bear the environment during the plasma process.

Figure 5:
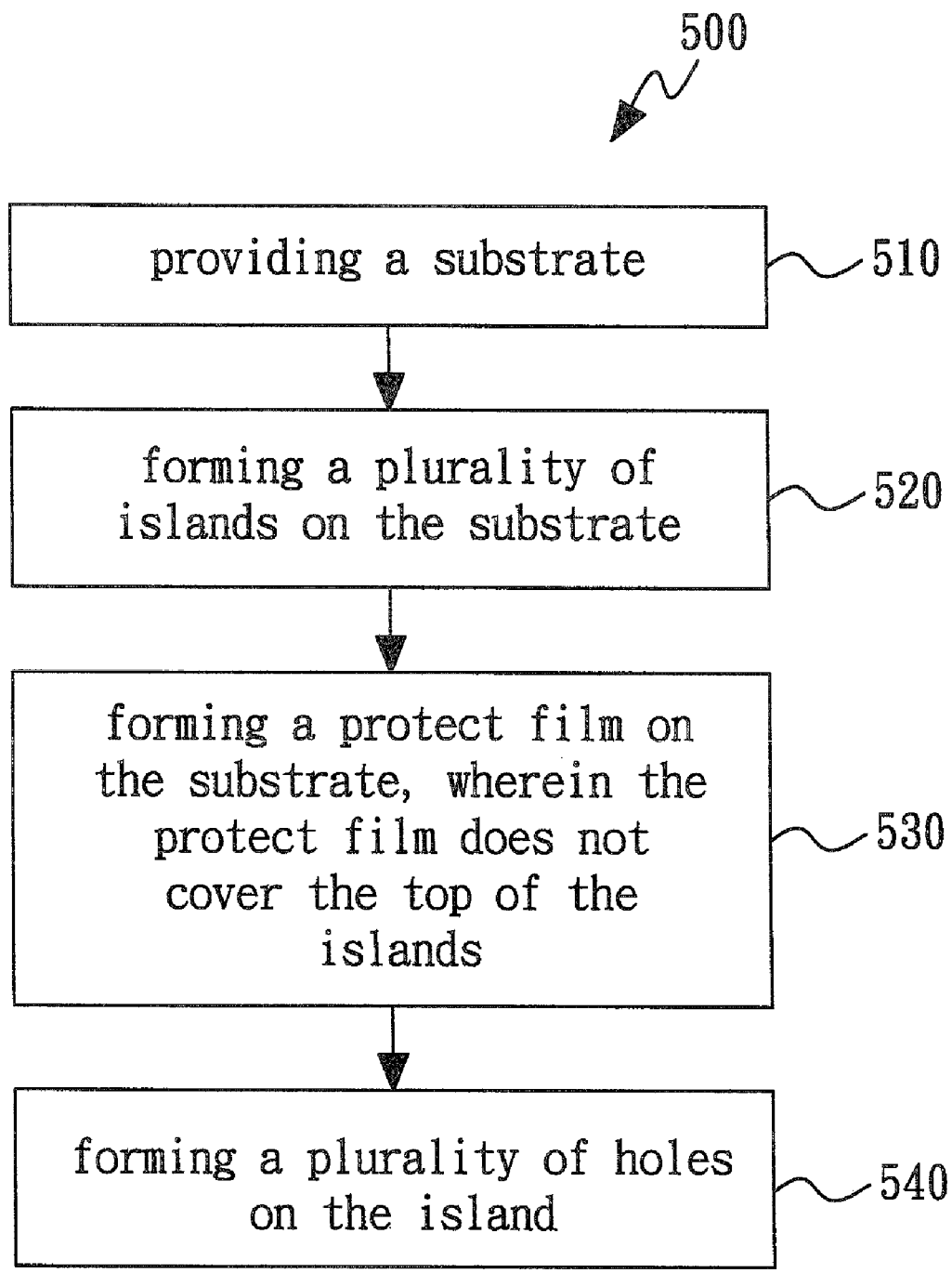
FIG. 5 shows the flow diagram for a method of making a showerhead in accordance with another embodiment of the present invention.

FIG. 5 shows the flow diagram for a method of making a showerhead in accordance with another embodiment of the present invention. The method 500 includes the following steps: step 510, providing a substrate; step 520, forming a plurality of islands on the substrate; step 530, forming a protective film on the substrate, wherein the protective film does not cover the tops of the islands; and step 540, forming a plurality of holes in the islands.

Figure 6A:
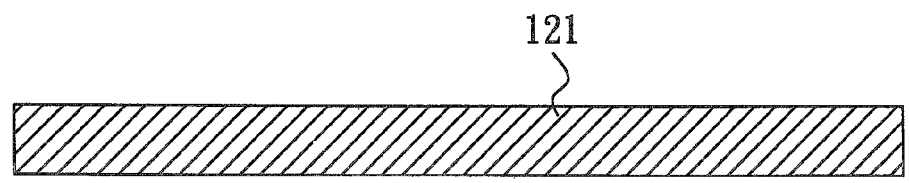
FIGS. 6A-6D show the steps for making the showerhead.
Figure 6B:
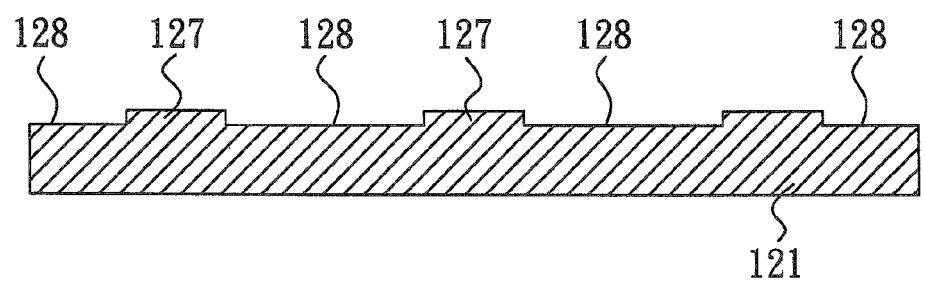
Figure 6C:
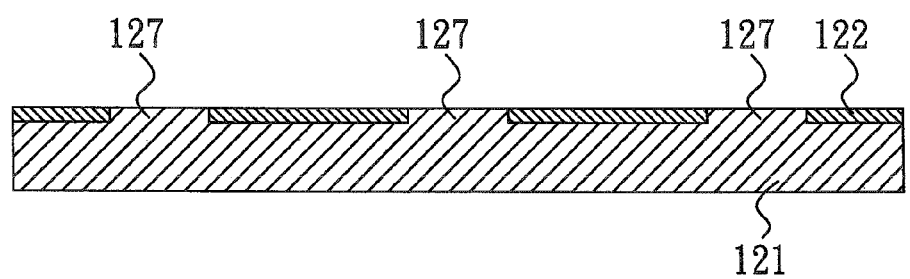
Figure 6D:
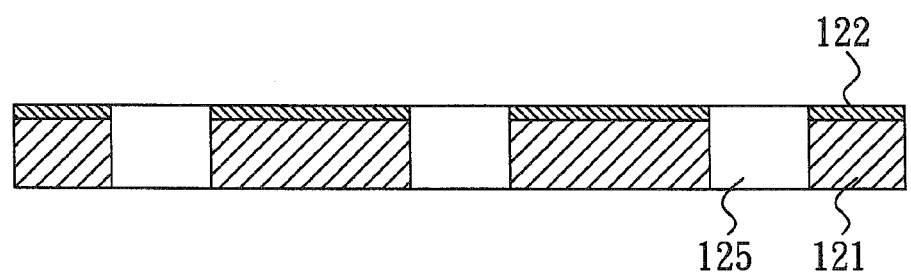

FIGS. 6A-6D show the steps for making the showerhead 120. Referring to FIG. 6A, a substrate 121 is provided. Referring to FIG. 6B, a plurality of islands 127 are formed on the substrate 121. The islands 127 are formed by removing parts 128 of the substrate 121. Referring to FIG. 6C, a protective film 122 is formed on the substrate 121, wherein the protective film 122 does not cover the tops of the islands 127. Referring to FIG. 6D, a plurality of holes 125 is formed in the islands 127.

In this embodiment, the substrate 121 is a graphite substrate. The protective film 122 is a silicon carbide film which is formed by chemical vapor deposition. Referring to FIG. 6C, the protective film 122 does not cover the islands 127, thus the holes 125 can be formed in the islands 127 by machine drilling without cutting fluid. The cutting fluid which is used in the machine drilling process will not be retained within the graphite substrate.

By way of the showerhead of the present invention and the method of making the showerhead, the costs of making the showerhead are decreased. The service life of the showerhead is increased and the associated contamination of semiconductor materials during plasma processing is minimized. Since the service life of the showerhead is increased, the down time of the apparatus is reduced; it is contributed to reducing the cost of processing semiconductor materials.

Although specific embodiments have been illustrated and described, it will be appreciated by those skilled in the art that various modifications may be made without departing from the scope of the present invention, which is intended to be limited solely by the appended claims.

What is claimed is:

1. A method of making a showerhead for a semiconductor processing apparatus, comprising:
    providing a substrate;
    forming a plurality of first holes in said substrate, said first holes having a first diameter;
    forming a protective film on said substrate, wherein said protective film covers sidewalls of said first holes; and
    forming a plurality of second holes in the positions of said first holes, said second holes having a second diameter, wherein said second diameter is smaller than said first diameter.

2. The method of making a showerhead for a semiconductor processing apparatus according to claim 1, wherein said substrate is a graphite substrate.

3. The method of making a showerhead for a semiconductor processing apparatus according to claim 1, wherein said protective film is a silicon carbide film formed by chemical vapor deposition, and the electric resistance of said silicon carbide film is about 1000000 ohm per cm.

4. The method of making a showerhead for a semiconductor processing apparatus according to claim 1, wherein said protective film is a silicon carbide film which is formed by chemical vapor deposition, and the thickness of said silicon carbide film is more than or equal to about 3 mm.

5. The method of making a showerhead for a semiconductor processing apparatus according to claim 1, wherein said substrate comprises one or more of graphite, single crystal silicon, polycrystalline silicon, silicon carbide, quartz, and sapphire.

6. The method of making a showerhead for a semiconductor processing apparatus according to claim 1, wherein said protective film comprises a hi-resistivity oxide material, said hi-resistivity oxide material comprising one or more of $Y_2O_3$, $ZnO_2$, $ZrO_2$, $HfO_2$, $TiO_2$, and $Bi_2O_3$.

7. The method of making a showerhead for a semiconductor processing apparatus according to claim 1, wherein said protective film comprises a metal-doped oxide material, said metal-doped oxide material comprising one or more of $Y_2O_3$, Eu, and ZnO—Al.

8. The method of making a showerhead for a semiconductor processing apparatus according to claim 1, wherein said protective film comprises a two phase oxide material, said two phase oxide material comprising one or more of $Al_2O_3$, $ZrO_2$, and $Y_2O_3$.

9. The method of making a showerhead for a semiconductor processing apparatus according to claim 1, wherein said protective film comprises a rare-earth oxide material, said rare-earth oxide material comprising one or more of $Gd_2O_3$, $Nd_2O_3$, and $Yb_2O_3$.

10. The method of making a showerhead for a semiconductor processing apparatus according to claim 1, wherein said protective film comprises a thin-film CVD material, said thin-film CVD material comprising one or more of AlN, BN, and SiC.

11. A method of making a showerhead for a semiconductor processing apparatus, comprising:
    providing a substrate;
    forming a plurality of islands on said substrate;
    forming a protective film on said substrate, wherein said protective film does not cover the tops of said islands; and
    forming a plurality of holes on the tops of said islands so as to remove said islands completely.

12. The method of making a showerhead for a semiconductor processing apparatus according to claim 11, wherein said substrate is a graphite substrate.

13. The method of making a showerhead for a semiconductor processing apparatus according to claim 11, wherein said protective film is a silicon carbide film formed by chemical vapor deposition, and the electric resistance of said silicon carbide film is about 1000000 ohm per cm.

14. The method of making a showerhead for a semiconductor processing apparatus according to claim 11, wherein said protective film is a silicon carbide film formed by chemical vapor deposition with a thickness greater than or equal to about 3 mm.

15. The method of making a showerhead for a semiconductor processing apparatus according to claim 11, wherein said substrate comprises one or more of graphite, single crystal silicon, polycrystalline silicon, silicon carbide, quartz, and sapphire.

16. The method of making a showerhead for a semiconductor processing apparatus according to claim 11, wherein said protective film comprises a hi-resistivity oxide material, said hi-resistivity oxide material comprising one or more of $Y_2O_3$, $ZnO_2$, $ZrO_2$, $HfO_2$, $TiO_2$, and $Bi_2O_3$.

17. The method of making a showerhead for a semiconductor processing apparatus according to claim 11, wherein said protective film comprises a metal-doped oxide material, said metal-doped oxide material comprising one or more of $Y_2O_3$, Eu, and ZnOAl.

18. The method of making a showerhead for a semiconductor processing apparatus according to claim 11, wherein said protective film comprises a two phase oxide material, said two phase oxide material comprising one or more of $Al_2O_3$, $ZrO_2$, and $Y_2O_3$.

19. The method of making a showerhead for a semiconductor processing apparatus according to claim 11, wherein said protective film comprises a rare-earth oxide material, said rare-earth oxide material comprising one or more of $Gd_2O_3$, $Nd_2O_3$, and $Yb_2O_3$.

20. The method of making a showerhead for a semiconductor processing apparatus according to claim 11, wherein said protective film comprises a thin-film CVD material, said thin-film CVD material comprising one or more of AlN, BN, and SiC.

21. The method of making a showerhead for a semiconductor processing apparatus according to claim 1, wherein a part of said protective film within said first holes is removed and another part of said protective film covers sidewalls of said first holes.

* * * * *